United States Patent [19] [11] Patent Number: 4,547,750
Torizuka et al. [45] Date of Patent: Oct. 15, 1985

[54] FET OSCILLATOR EXHIBITING NEGATIVE REISISTANCE DUE TO HIGH IMPEDANCE AT THE SOURCE OF AN FET THEREOF

[75] Inventors: Hideki Torizuka, Kawasaki; Tomohide Soejima, Yokohamashi; Shigekazu Hori, Yokohama, all of Japan

[73] Assignee: Tokyo Shibaura Denki Kabushiki Kaisha, Japan

[21] Appl. No.: 458,940

[22] Filed: Jan. 18, 1983

[30] Foreign Application Priority Data

Jan. 20, 1982 [JP] Japan ................................ 57-5886

[51] Int. Cl.[4] .......................... H03B 5/04; H03B 5/18
[52] U.S. Cl. ............................... 331/99; 331/107 SL; 331/115; 331/116 FE; 331/117 FE
[58] Field of Search ............... 331/99, 107 SL, 108 C, 331/115, 116 FE, 117 FE

[56] References Cited

U.S. PATENT DOCUMENTS

| 4,149,127 | 4/1979 | Murakami et al. | 331/99 X |
| 4,187,476 | 2/1980 | Shinkawa et al. | 331/99 X |
| 4,189,688 | 2/1980 | Sechi et al. | 331/99 X |
| 4,435,688 | 3/1984 | Shinkawa et al. | 331/99 |
| 4,445,097 | 4/1984 | Godart et al. | 331/117 FE |

FOREIGN PATENT DOCUMENTS 0083556  7/1978  Japan ............................ 331/107 SL

OTHER PUBLICATIONS

Wade, Paul C., "Say Hello To Power FET Oscillators", *Microwaves,* Apr. '79, pp. 104-109.
Abe, H. et al., "Stabilized C-Band GaAs FET Oscillator", *Microwave Journal,* Oct. '77, pp. 52-55.
Mitsui, Y. et al., "Design of GaAs MESFET Oscillator Using Large-Signal S-Parameters, *IEEE Transactions on Microwave Theory and Techniques,* vol. MTT-25, No. 12, Dec. '77, pp. 981-984.

Primary Examiner—Eugene R. LaRoche
Assistant Examiner—D. C. Mis
Attorney, Agent, or Firm—Finnegan, Henderson, Farabow, Garrett & Dunner

[57] ABSTRACT

An FET oscillator wherein a bias circuit is connected to a drain of a field-effect transistor and a source circuit including a transmission line and a self-bias circuit is connected to a source of the transistor, so that the source is substantially open-circuited at an oscillation frequency and the field-effect transistor operates as a two-terminal (the gate and drain) element exhibiting a negative resistance, and wherein a resonant circuit is connected to the gate of the transistor. With the source circuit connected to the transistor source, the oscillator can have a high unloaded Q-value of Qo and a high externally-loaded Q-value of $Q_{ext}$, whereby the oscillation frequency is stable. According to this oscillator, only a single bias circuit for the drain is required without the need of a bias circuit for the gate.

8 Claims, 9 Drawing Figures

FET OSCILLATOR EXHIBITING NEGATIVE RESISTANCE DUE TO HIGH IMPEDANCE AT THE SOURCE OF AN FET THEREOF

BACKGROUND OF THE INVENTION

1. Field of the Invention

The present invention relates generally to an FET oscillator based on a field-effect transistor, and more particularly, to an oscillator which is simple in arrangement and exhibits an excellent oscillation characteristic.

2. Description of the Prior Art

A prior art oscillator employing a field-effect transistor (hereinafter referred to as the FET) as a microwave FET oscillator is shown in FIG. 1. Explanation will first be made as to the prior art of FIG. 1 for better understanding of the present invention.

Referring to FIG. 1, an FET circuit 1 has a pair of terminals $4_1$ and $4_2$ connected with a resonant circuit 2 and the other pair of terminals $5_1$ and $5_2$ connected with a matching circuit 3, an oscillation output being generated at a pair of output terminals $6_1$ and $6_2$. The resonant circuit 2 is made up of transmission lines 8 connected at one end with a resistance 9 as a dummy load and a dielectric resonator 7 electromagnetically coupled with the lines 8, in order to obtain a stabilized oscillation output or frequency.

In the microwave FET oscillator shown in FIG. 1, assume that the FET circuit 1 has S parameters $S_{11}$, $S_{12}$, $S_{21}$ and $S_{22}$, in which $r_1$ denotes the reflection coefficient of the resonant circuit 2 as viewed from the terminal pair $4_1$ and $4_2$, and $\Gamma_D$ denotes the reflection coefficient of the FET circuit 1 as viewed from the terminal pair $5_1$ and $5_2$. Then, the reflection coefficient is expressed as $$\Gamma_D = \frac{r_1 S_{12} S_{21}}{1 - S_{11} r_1} + S_{22} \quad (1)$$

For the microwave FET oscillator to oscillate, $|\Gamma_D|$ must be greater than 1. Therefore, if the S parameters of the FET circuit 1 are given, $|r_1|$ will have a minimum of $|r_1|_{min}$ under the condition of $|r_D| > 2$.

On the other hand, FIG. 2 is a curve 10 showing a relation of $|r_1|$ with respect to a distance d (see FIG. 1) between the dielectric resonator 7 and the lines 8, wherein the maximum distance $d_{max}$ corresponds to $|r_1|_{min}$.

For the oscillator employing the dielectric resonator 7, Q-values of the resonator with and without an external load, i.e., $Q_{ext}$ and $Q_o$ must be increased for a better frequency stability, whereas the smaller the distance d is the smaller the values $Q_o$ and $Q_{ext}$ are. More specifically, in order to stabilize the frequency of the oscillator, it is desirable to increase the distance d ($d < d_{max}$), but $|\Gamma_D|$ will correspondingly become smaller as seen from FIG. 2 and equation (1), which results in that its oscillation tends to be difficult to occur and its output level is reduced. From the above consideration, if such an FET circuit 1 can be realized which has a small value of $|r_1|_{min}$ and yet satisfies the oscillation requirement, then easy oscillation and stable frequency can both be achieved.

In general, three common circuit configuration; common-source, common-gate, and common-drain configurations, have been used in microwave oscillators employing a GaAs FET. On the other hand, an enclosure used to package an FET usually has a construction as shown in FIG. 3. That is, a gate 12, a drain 13 and two sources $14_1$ and $14_2$ of the FET extend out of a body 11 of the packaging enclosure, and an upper face 15 of the enclosure body 11 is kept at the same potential as the sources $14_1$ and $14_2$ by means of a metallic pattern 16 provided on a side wall of the body. The FET package with such a structure is desirable for a common-source configuration and further in providing its input and output circuits because the gate 12 is aligned linearly with the drain 13.

With a package of such a structure, on the other hand, when it is desired to employ a common-gate or common-drain configuration, the resonant circuit must be disposed at a right angle with respect to the matching circuit on the output side, involving such difficulties that the circuit arrangement becomes complex and unnecessary oscillation tends to occur due to mutual interference between the lines.

Next, more detailed explanation will be directed to an arrangement of a prior-art common-source FET oscillator shown in FIG. 4 wherein parts already described in FIG. 1 are denoted by the same reference numerals. In FIG. 4, as in FIG. 1, the FET 1 has the pair of terminals $4_1$ and $4_2$ connected with the resonant circuit 2 and the other pair of terminals $5_1$ and $5_2$ connected with the matching circuit 3, an oscillation output being generated at the pair of output terminals $6_1$ and $6_2$. However, the FET circuit 1 in FIG. 4 is configured differently from that in FIG. 1. That is, an FET 21 has a source 22, a gate 23, and a drain 24. To the gate 23 a bias voltage $V_G$ is applied from a terminal 26 through an RF choke 28, whereas to the drain terminal 24 another bias voltage $V_D$ is applied from a terminal 25 through an RF choke 27. Further, between the gate 23 and the drain 24, there is a feedback network 17 consisting of an inductor 18 and a capacitor 19 for blocking D.C. signals. Capacitors 29 and 30 having the same function as the capacitor 19 are provided respectively between the terminal $4_1$ and the resonant circuit 2 as well as between the matching circuit 3 and the terminal $6_1$.

The FET circuit 1 in FIG. 4, has different values in its S parameters depending upon whether the feedback network 17 is included or not. By calculating a value $|r_1|_{min}$ satisfying the relation $|\Gamma_D| = 1$ on the basis of the S parameter values which differ depending on the presence or absence of the feedback network 17, it has been found that addition of the feedback network 17 in the FET circuit 1 provides a smaller value for $|r_1|_{min}$. This means that, even if the distance d indicated in FIG. 2 is increased, a stable oscillation can be obtained.

As explained above, in the prior-art grounded-source FET oscillator, the feedback network 17 is placed between the gate terminal 23 and drain terminal 24 of the FET 21 in order to provide a stabilized oscillation. However, such a prior art oscillator has problems in that the feedback network 17 must be provided outside of the FET packaging enclosure and thus the circuit configuration becomes complex and the feedback frequency range becomes narrow, and further in that it is necessary to apply two types of bias voltages, i.e., the positive voltage $V_D$ to the drain 24 and the negative voltage $V_G$ to the gate 23.

SUMMARY OF THE INVENTION

Accordingly, it is an object of the present invention to provide an FET oscillator which is simple in its arrangement and offers an excellent oscillation characteristic.

In a preferred aspect of the present invention, a bias circuit is connected to a drain of a field-effect transistor and a microstrip line including a self-bias circuit is connected to a source of the transistor whereby the microstrip line and resistor are determined to give a high impedance at the source terminal. More specifically, with an FET oscillator of the invention, the FET has a drain connected with the bias circuit and the matching circuit and a gate connected with the resonant circuit and a source connected with the high impedance source circuit consisting of a transmission line and a self-bias resistance, whereby the souce of the FET is grounded through the self-bias circuit with respect to D.C. signals and is substantially opened with respect to the oscillation frequency signal.

In accordance with the present invention, by inserting into the FET source circuit the circuit which exhibits a high impedance at the oscillation frequency, the $Q_{ext}$-value of the resonator can be made high and the oscillation frequency of the FET oscillator can be made stable. Further, in the case where a resonator of electronic tuning type is used, the FET oscillator can be made higher in its electronic tuning sensitivity. In addition, since a single positive bias voltage only for the drain is required without the need for the bias voltage for the gate, the arrangement of the FET oscillator can be simplified. Furthermore, the FET oscillator according to the present invention is suitable especially as a microwave oscillator with preferred effects.

BRIEF DESCRIPTION OF THE DRAWINGS

The above and other objects and advantages of the present invention will become clear from the following description with reference to the accompanying drawings, in which:

FIGS. 7 to 9 show different embodiments of the present invention wherein FIG. 7 is a circuit diagram of the FET oscillator fabricated in the form of an MIC (microwave integrated circuit), and FIGS. 8 and 9 are different circuit diagrams of the FET oscillator fabricated in the form of an MMIC (monolithic microwave integrated circuit).

DESCRIPTION OF THE PREFERRED EMBODIMENTS

Figure 1:
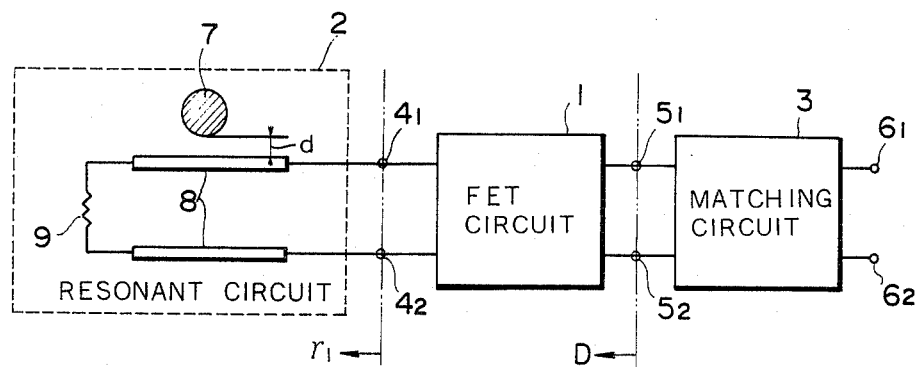
FIG. 1 is a block diagram of a circuit configuration of a prior-art FET oscillator.
Figure 2:
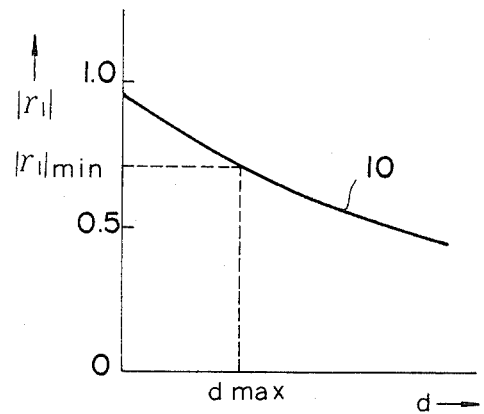
FIG. 2 is a graph showing a relation of a reflection coefficient $|r_1|$ of a resonant circuit with respect to a gap distance d between a dielectric resonator and transmission lines.
Figure 3:
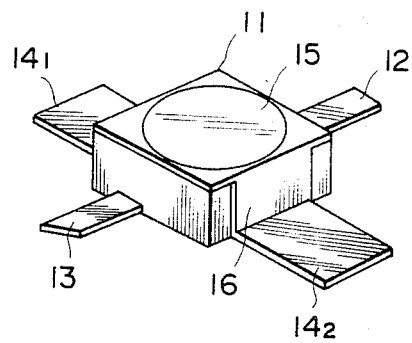
FIG. 3 is a perspective view of an enclosure for packaging an FET.
Figure 4:
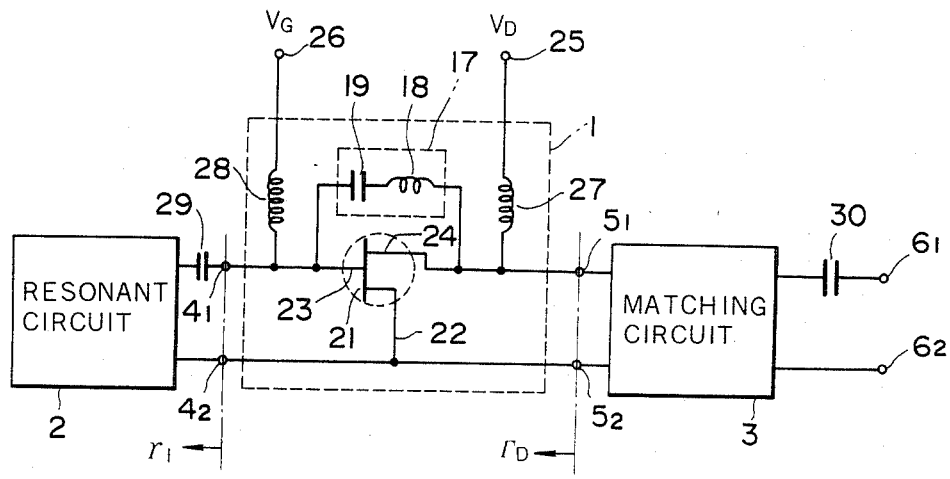
FIG. 4 is a circuit diagram of a prior-art common-source FET oscillator of a feedback type.
Figure 5:
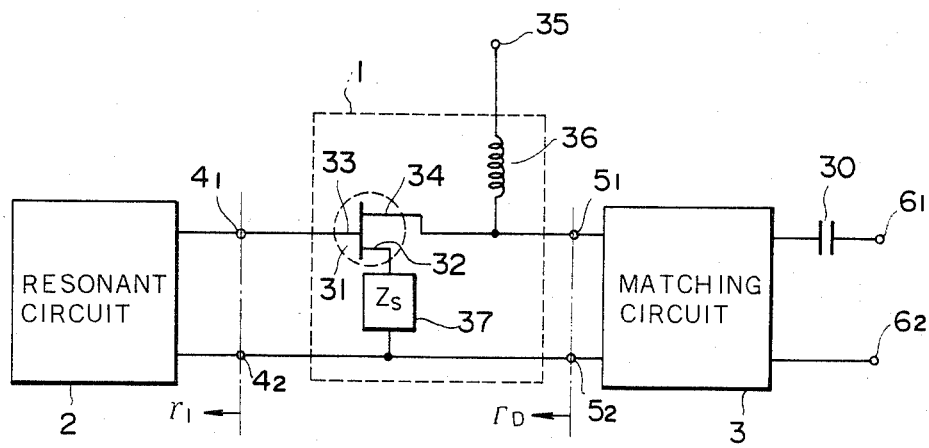
FIG. 5 is a block diagram of an FET oscillator in accordance with an embodiment of the present invention.

Referring to FIG. 5, there is shown a block diagram of an FET oscillator in accordance with the present invention wherein parts already described in FIG. 1 are denoted by the same reference numerals. As in the prior art of FIG. 1, the FET circuit 1 has the pair of terminals $4_1$ and $4_2$ connected with the resonant circuit 2 and the other pair of terminals $5_1$ and $5_2$ connected with the matching circuit 3, the oscillation output being generated at the pair of output terminals $6_1$ and $6_2$. However, the FET circuit 1 in FIG. 5 is different from that in FIG. 1, in that an FET 31 has a source 32, a gate 33 and a drain 34, the drain 34 being connected through an RF choke 36 to a bias terminal 35 and a source circuit 37 of an impedance value $Z_s$ being inserted between the source 32 and the ground.

The source circuit 37 exhibits an impedance value $Z_s$ at the oscillation frequency and exhibits a resistance value R for D.C. signals. If a drain current $I_{ds}$ in the FET 31 is 20 mA and a voltage $V_{gs}$ of the gate 33 with respect to the source 32 is $-1.5$ V, for example, then the resistance value R is selected to be $|V_{gs}/I_{ds}| = 75$ ohms. On the other hand, the impedance value $Z_s$ at the oscillation frequency is determined by the microwave characteristics of the FET 31. When an ordinary FET available in the market is used in the common-source configuration, S parameters of the FET at a frequency 10 GHz have usually values as shown in table below.

TABLE

|  | $|S_{ij}|$ | $<S_{ij}$ |
|---|---|---|
| $S_{11}$ | 0.802 | 176.4 |
| $S_{12}$ | 0.166 | $-54.1$ |
| $S_{21}$ | 0.886 | 4.4 |
| $S_{22}$ | 0.698 | $-159.4$ |

Figure 6:
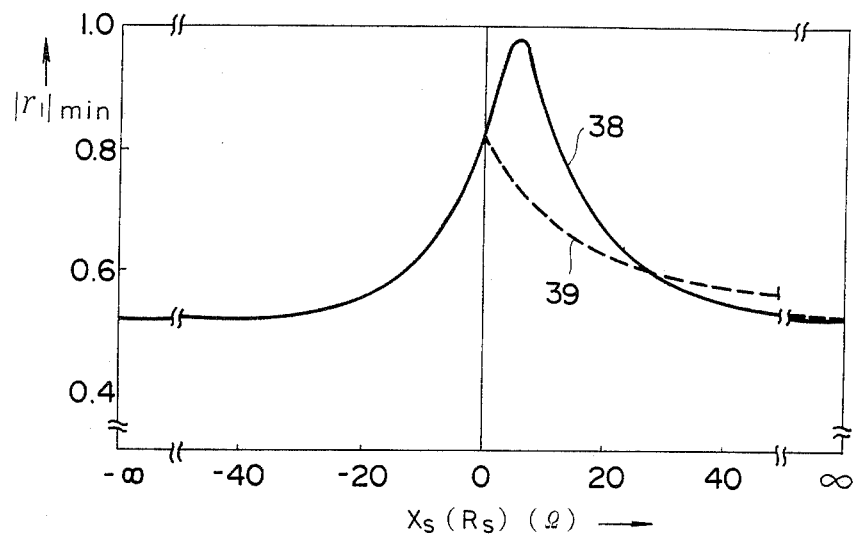
FIG. 6 is a graph showing a relation of $|r_1|_{min}$ with respect to the resistance and reactance values of an impedance circuit provided to a source of the FET in FIG. 5.

Curves 38 and 39 in FIG. 6 are obtained by calculating new S parameters of the FET when the source circuit 37 with the impedance $Z_s (= R_s + jX_s)$ is inserted between the source 32 and the ground and the S parameters are given in the above Table, and then by plotting $|r_1|$ according to equation (1) using the new S parameter values obtained. More specifically, in FIG. 6, the curve 38 shown by a solid line represents the variation of $|r_1|_{min}$ with respect to $X_s$ when $R_s = 0$, while the curve 39 represents the variation of $|r_1|_{min}$ with respect to $R_s$ when $X_s = 0$. From FIG. 6, it is found that $|r_1|_{min}$ will decrease with the increase of $R_s$ and $X_s$ and have a minimum value when $X_s = \pm \infty$ or $R_s = \infty$, providing the widest spacing d between the dielectric resonator 7 and the transmission lines 8 in the resonant circuit 2 shown in FIG. 1. In other words, when the impedance $Z_s$ larger than a certain value is inserted into the source 32 the oscillator can be made high in its frequency stability, while when the absolute value $|Z_s|$ of the impedance $Z_s$ is infinity $\infty$ the oscillator can be made highest in the frequency stability. As a result, when the impedance $Z_s (= R_s + jX_s)$ having $X_s$ of $\infty$ and $R_s$ of $|V_{gs}/I_{ds}|$ is placed into the source circuit 32, the source 32 is open-circuited for the oscillation frequency, whereby the FET circuit is operated as a two-terminal (the gate 33 and the drain 34) element.

Figure 7:
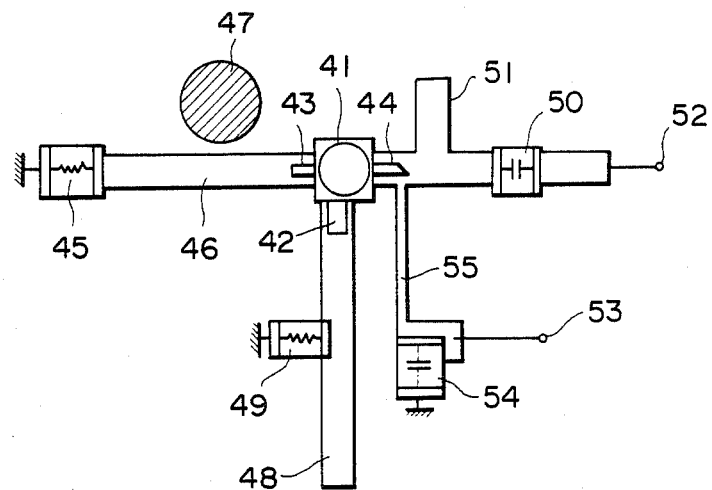

There is shown in FIG. 7, an embodiment of the present invention in the case where microstrip lines are formed on a dielectric substrate. In the illustrated embodiment, an FET 41 has a source 42, a gate 43 and a drain 44, the gate 43 being connected with a resonant circuit. The resonant circuit in turn comprises a microstrip line 46 placed at its one end with a resistance 45 as a dummy load and a dielectric resonator 47 electromagnetically coupled with the transmission line 46. A microstrip line 48 is connected to the source terminal 42, with the other end of the line 48 being open-circuited and the line 48 being connected through a resistance 49 to the ground at a point $\lambda g/4$ ($\lambda g$ denotes the wavelength) from the open end of the line. The oscillation output of the oscillator is obtained from an output terminal 52 via a matching circuit 51 and a D.C. signal blocking capacitor 50. A bias voltage for the FET 41 is applied to the drain 44 from a terminal 53 through a high-impedance line 55 whose one end is short-circuited by a capacitor 54 with respect to microwaves.

With the FET oscillator of such an arrangement, the impedance $Z_s$ of the circuit provided to the source 42 exhibits a pure reactance $X_s$ at the oscillation frequency, and the curve 38 in FIG. 6 represents the variation in $|r_1|_{min}$ as the distance or length ($l_s$) between the source 42 and the resistance 49 on the line 48 varies from 0 to $\lambda g/4$ (from $X_s=0$ to $X_s=\infty$) and from $\lambda g/4$ to $\lambda g/2$ (from $X_s=-\infty$ to $X_s=0$). It will be seen from the curve 38 $|r_1|_{min}$ has a minimum value at $X_s=\infty$ when the source-resistance distance ($l_s$) is $\lambda g/4$. Under this condition, the value of the impedance $Z_s$ at the oscillation frequency will not depend upon the resistance value R of the resistance 49, and thus the oscillation output will not be decreased by adding the resistance 49. Further, addition of the resistance 49 will allow the FET 41 to be operated with a single positive voltage supply, whereby the bias circuit provided to the gate of the FET in the prior art can be eliminated and thus its circuit configuration can be simplified. In additon, since the resistance 49 is inserted into the circuit provided to the source 42, the circuit will not form a resonant circuit with respect to low frequencies below the oscillation frequency, whereby oscillations in unnecessary modes can be suppressed.

The embodiment of FIG. 7 has been explained in the case where the impedance $Z_s$ exhibits the pure reactance $X_s$, but it will be seen from FIG. 6 that it is unnecessary for the real part $R_s$ in the impedance $Z_s$ to be always zero and if $|Z_s|$ is sufficiently large, then the same effect can be obtained. For this reason, the length of the microstrip line 48 is not restricted to $\lambda g/2$, and also with respect to the connecting position of the resistance 49 on the microstrip line 48 the resistance 49 is not restricted to a position $\lambda g/4$ from the open end of the line 48. For example, even if the length of the transmission line 48 is set to be $\lambda g/4$ and the termination end of the line 48 is connected via the resistance 49 to the ground, the object of the present invention can be achieved by selecting the characteristic impedance $Z_o$ of the microstrip line 48 to be larger than the value R of the resistance 49.

When the length of the line 48 is set to be about $\lambda g/4$ and the termination end of the line 48 is short-circuited with respect to microwaves and D.C. and the resistance 49 is provided between the source 42 and the line 48, the impedance $Z_s$ becomes large. Thus, in this case, the object of the invention can be also accomplished. In other words, in the case where the FET has such S parameters given in Table earlier, it will be clear from FIG. 6 that the effect of the invention can be obtained so long as $R_s$ is $|V_{gs}/I_{ds}|$ and $X_s$ is set to be larger than about 15 ohms or smaller than 0 ohms in order to obtain an $|r_1|_{min}$ of less than 0.8 (see FIG. 6).

The FET oscillator of FIG. 7 has been fabricated in the form of a microstrip circuit, i.e., a microwave integrated circuit (referred to as MIC).

Figure 8:
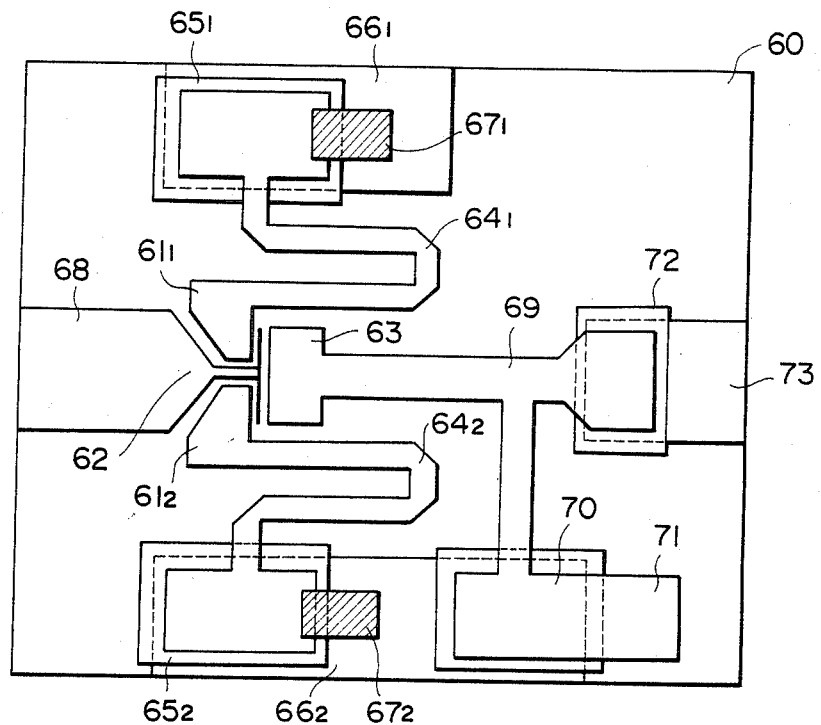
Figure 9:
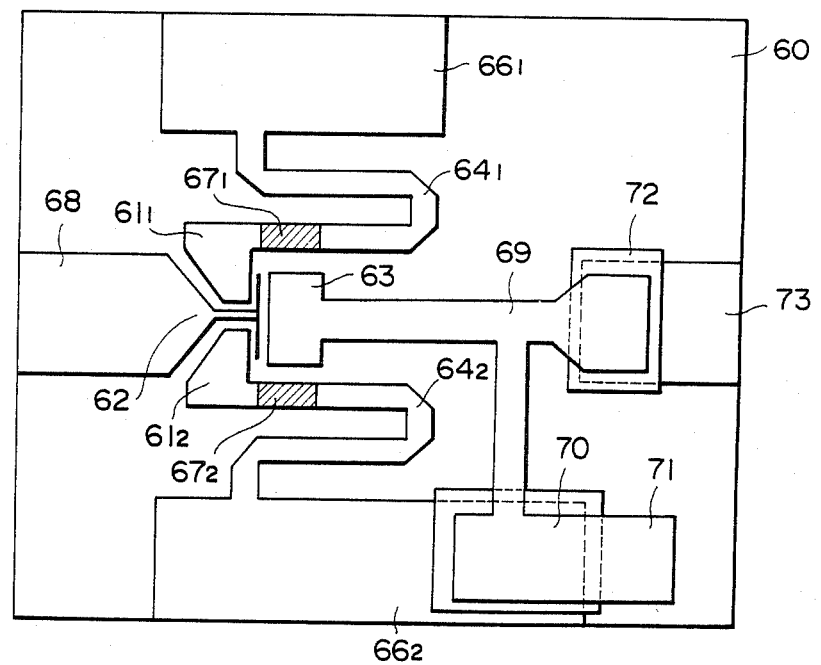

FIGS. 8 and 9 show FET oscillators of different embodiments of the present invention wherein the FET circuit 1 and the matching circuit 3 are fabricated on a semiconductor (such as GaAs) substrate, that is, in the form of a monolithic macrowave integrated circuit (referred to as MMIC).

Referring first to FIG. 8, an FET having sources $61_1$ and $61_2$, a gate 62 and a drain 63 is formed on a semiconductor substrate 60 (made of GaAs, for example) which in turn is provided on its back face with a conductive film. Microstrip lines $64_1$ and $64_2$ are connected to sources $61_1$ and $61_2$, respectively. Other ends of the strip lines $64_1$ and $64_2$ are short-circuited with respect to microwaves by providing at the other ends dielectric films $65_1$ and $65_2$ and grounding electrodes $66_1$ and $66_2$ to form capacitors therebetween, and at the same time the lines $64_1$ and $64_2$ are connected to the ground through resistances $67_1$ and $67_2$ indicated by hatched areas, respectively.

Further, the gate 62 is connected with a line 68 which in turn is connected with a resonant circuit (not shown). The drain 63 is connected with a line 69 which functions both as a matching circuit and as a bias circuit. The line 69 is provided at its other end with an electrode 71 ad the other end is short-circuited by a capacitor 70 with respect to microwaves. To the electrode 71 a positive bias voltage is applied. Further, the line 69 is provided at its output end with a dielectric film 72 and an output electrode 73 which both form a D.C. blocking capacitor.

The equivalent circuit and operational principle of the FET ocillator shown in FIG. 8 are the same as those of the MIC oscillator of FIG. 7, but a difference therebetween is that the termination ends of the strip lines $64_1$ and $64_2$ provided to the respective sources $61_1$ and $61_2$ are short-circuited with respect to microwaves and connected to the ground via the resistances in FIG. 8, as already described above.

In this way, even if the resistances $67_1$ and $67_2$ are provided at the respective tip ends of the strip lines $64_1$ and $64_2$ having a length of about $\lambda g/4$ the effects according to the invention can be obtained because the termination ends of the lines $64_1$ and $64_2$ are short-circuited with respect to microwaves. Further, the length of the strip line $64_1$ or $64_2$ is not limited to $\lambda g/4$ and so long as the impedance $Z_s$ of the strip lines $64_1$ and $64_2$ as viewed from the sources $61_1$ and $61_2$ has such a value that allows a reduction of $|r_1|_{min}$ found using the S parameters of an available FET as shown in FIG. 6, the FET oscillator of the invention can be realized. In this connection, the characteristic impedance of the strip lines $64_1$ and $64_2$ is selected to be greater than the value of the resistances $67_1$ and $67_2$, it is possible to eliminate the dielectric films $65_1$ and $65_2$ and the grounding electrodes $66_1$ and $66_2$ which are provided at the one ends of the strip lines $64_1$ and $64_2$ and form capacitors therebetween as in the embodiment of FIG. 7.

Next, a modification of the embodiment of FIG. 8 will be explained with reference to FIG. 9 in which parts already explained in FIG. 8 are denoted by the same reference numerals and explanations thereof are omitted. In the modification, the sources $61_1$ and $61_2$ are connected with the respective resistances $67_1$ and $67_2$ which in turn are connected with the microstrip lines $64_1$ and $64_2$. The other ends of the lines $64_1$ and $64_2$ are connected via the grounding electrodes $66_1$ and $66_2$ to the ground. With such a structure shown in FIG. 9, the object of the invention can be achieved.

As disclosed in the foregoing, the FET oscillators of MMIC type of FIGS. 8 and 9 can be made simple in structure remarkably compact and high in performance.

Further, the resistances $67_1$ and $67_2$ in FIGS. 8 and 9 may be replaced by diodes formed on the semiconductor substrate. In addition, the resonator provided to the gate 62 is not restricted to a dielectric resonator, and may be replaced by a wide-band electronic tuning circuit.

Though the gate and drain of the FET have been connected with the resonant circuit and the matching circuit respectively in the above FET oscillators, the gate of the FET may be connected to a pure reactive circuit and the drain of the FET may be connected to the resonant circuit with matching circuit yielding exactly the same effects as in the invention. The latter is called a transmission-type FET oscillator. In this construction, the resonant circuit 2 and the matching circuit 3 in FIG. 5 are replaced with each other. When the circuit connected to the gate is composed of a pure reactance element, $|r_1|$ may be about 1. From calculation of the reflection coefficient $\Gamma_D$ (that is, equation (1)) when $|r_1|$ is about 1, it will be found that the larger $|Z_s|$ is larger $|\Gamma_D|$ is. This means that the reflection coefficient of the resonant circuit provided to the drain can be made small, whereby the transmission-type FET oscillator can be realized with its high frequency stability.

On the other hand, in FIGS. 8 and 9, if the line 68 connected to the gate 62 is short-circuited with respect to microwaves and grounded with respect to D.C. signals, this means that the gate 62 is terminated with the low reactance circuit and thus the FET can operate as a two-terminal (between the output electrode 73 and the ground) negative resistance element. Accordingly, if a resonant circuit (not shown) is provided to the output electrode 73, the stable FET oscillator can be realized like the abovementioned FET oscillators.

In addition, even if the output electrode 73 is short-circuited with respect to microwaves and grounded with respect to D.C. signals, the FET can work as a two-terminal (between the line 68 connected to the gate 62 and the ground) negative resistance element as in the above case. Therefore, when a resonant circuit (not shown) is wired to the line (68), a stable FET oscillator can be realized similarly.

What is claimed is:

1. An FET oscillator exhibiting negative resistance due to a high impedance at the source of the FET thereof, comprising:
    a negative resistance circuit including a strip line of predetermined length, a biasing circuit, a resistor and a field effect transistor, said field effect transistor having a drain which is biased through said biasing circuit and a source which is connected to said strip line of predetermined length, said strip line being grounded via said resistor at a position which results in said strip line exhibiting substantially ground potential level at the oscillation frequency of said oscillator, thereby providing a negative resistance between the gate and drain of said field effect transistor, and
    a resonant circuit connected to said negative resistance circuit for determining the oscillation frequency of said oscillator.

2. An FET oscillator as set forth in claim 1 wherein said strip line is open-ended and has a length of $\lambda/2$, where $\lambda$ represents the wavelength corresponding to an oscillation frequency of said FET oscillator and said resistor is connected to said strip line at a position $\lambda/4$ apart from one end thereof to which said source of said field effect transistor is connected.

3. An FET oscillator as set forth in claim 1 wherein said strip line has a length of $\lambda/4$, where $\lambda$ represents the wavelength corresponding to an oscillation frequency of said FET oscillator and said resistor is connected between a termination end of said strip line and the ground, said FET oscillator further comprising a capacitor provided between said termination end and the ground.

4. An FET oscillator as set forth in claim 1 wherein said resonant circuit comprises a strip line connected at its one end to a resistor as a dummy load, and a dielectric resonator electromagnetically coupled with said strip line.

5. An FET oscillator exhibiting negative resistance due to a high impedance at the source of the FET thereof, comprising:
    a field effect transistor having a drain, a gate and a source;
    a matching circuit connected to said drain of said transistor;
    a resonant circuit connected to said gate of said transistor;
    a biasing circuit for biasing said drain of said field effect transistor;
    a strip line of a predetermined length connected to said source of said field effect transistor; and
    a resistor, one end of said resistor being connected to said strip line at a position which results in oscillated microwave voltage at said strip line being at substantially ground potential level for the oscillation frequency of said FET oscillator, the other end of said resistor being grounded.

6. An FET oscillator as set forth in claim 5 wherein said strip line is open-ended and has a length of $\lambda/2$, where $\lambda$ represents the wavelength corresponding to an oscillation frequency of said FET oscillator and said resistor is connected to said strip line at a position $\lambda/4$ apart from one end thereof to which said source of said field effect transistor is connected.

7. An FET oscillator as set forth in claim 5 wherein said strip line has a length of $\lambda/4$, where $\lambda$ represents the wavelength corresponding to an oscillation frequency of said FET oscillator and said resistor is connected between a termination end of said strip line and the ground, said FET oscillator further comprising a capacitor provided between said termination end and the ground.

8. An FET oscillator as set forth in any one of claims 1 to 7 wherein said strip line is a microstrip line.

* * * * *